(12) United States Patent
Stockton et al.

(10) Patent No.: US 11,233,437 B2
(45) Date of Patent: Jan. 25, 2022

(54) ELECTRICAL CONDUIT BOX FOR USE IN AN INDUSTRIAL A/C INDUCTION MOTOR HAZARDOUS ENVIRONMENT

(71) Applicant: ABB Schweiz AG, Baden (CH)

(72) Inventors: Chris Stockton, Greenville, SC (US); Matthew Truett, Simpsonville, SC (US); Steve Browne, Shelby, NC (US)

(73) Assignee: ABB Schweiz AG, Baden (CH)

( * ) Notice: Subject to any disclaimer, the term of this patent is extended or adjusted under 35 U.S.C. 154(b) by 588 days.

(21) Appl. No.: 16/050,814

(22) Filed: Jul. 31, 2018

(65) Prior Publication Data
US 2020/0044509 A1 Feb. 6, 2020

(51) Int. Cl.
| | | |
|---|---|---|
| *H02K 5/22* | (2006.01) | |
| *H02K 5/12* | (2006.01) | |
| *H02K 5/15* | (2006.01) | |
| *H02K 15/14* | (2006.01) | |
| *H05K 5/06* | (2006.01) | |
| *H02G 3/08* | (2006.01) | |

(52) U.S. Cl.
CPC ............... *H02K 5/225* (2013.01); *H02K 5/12* (2013.01); *H02K 5/15* (2013.01); *H02K 15/14* (2013.01); *H05K 5/06* (2013.01); *H02G 3/088* (2013.01)

(58) Field of Classification Search
CPC ....................................................... H02K 5/12
USPC ............................ 310/68 R, 75 R, 98; 174/50
See application file for complete search history.

(56) References Cited

U.S. PATENT DOCUMENTS

| | | | | |
|---|---|---|---|---|
| 1,799,071 | A | * 3/1931 | Smith | ...................... H02K 9/24 310/88 |
| 3,233,129 | A | 2/1966 | Schaefer | |
| RE35,075 | E | * 10/1995 | Lammens, Jr. | ........ H02G 3/083 174/650 |
| 5,486,650 | A | * 1/1996 | Yetter | ...................... H02G 3/10 174/53 |
| 6,002,083 | A | * 12/1999 | Workman | .............. H02K 5/225 174/17 CT |
| 9,466,962 | B1 | 10/2016 | Gretz | |

(Continued)

FOREIGN PATENT DOCUMENTS

| | | |
|---|---|---|
| CN | 105186766 A | 12/2015 |
| CN | 206116139 U | 4/2017 |

(Continued)

OTHER PUBLICATIONS

Anonymous, Terminal Boxes in Glass Fiber Reinforced Polyester (GRP), Mar. 4, 2014, 6 pp.

(Continued)

*Primary Examiner* — Jose A Gonzalez Quinones
(74) *Attorney, Agent, or Firm* — Leydig, Voit & Mayer, Ltd.

(57) ABSTRACT

A conduit box useful for mounting on an industrial size AC induction motor in a hazardous environment. The conduit box includes a cover and housing, a gasket seal between the cover and housing, and an internal partition wall. The conduit box is made of a cross-linked polymer matrix with a glass fiber content of about 26% by weight, in which the material has thermosetting dimensional stability and formed from a composition of polyesters and vinyl ester. The walls of the conduit box are tapered and the conduit box otherwise composed and constructed to meet requirements of the hazardous environment.

20 Claims, 4 Drawing Sheets

(56) References Cited

U.S. PATENT DOCUMENTS

| | | | |
|---|---|---|---|
| 2006/0037773 A1* | 2/2006 | Castaldo | H02G 3/088 |
| | | | 174/66 |
| 2006/0066162 A1* | 3/2006 | Woodson | H02K 5/225 |
| | | | 310/71 |
| 2010/0122826 A1 | 5/2010 | de la Borbolla | |
| 2011/0209913 A1 | 9/2011 | Green et al. | |
| 2013/0294949 A1 | 11/2013 | Blaser et al. | |
| 2013/0299138 A1* | 11/2013 | Colson | H02K 5/225 |
| | | | 165/104.34 |
| 2014/0090863 A1 | 4/2014 | Korcz et al. | |

FOREIGN PATENT DOCUMENTS

| | | | |
|---|---|---|---|
| EP | 0731627 A1 | | 9/1996 |
| EP | 1156566 A2 | | 11/2001 |
| JP | 2000349452 A | * | 12/2000 |

OTHER PUBLICATIONS

Anonymous, Terminal Boxes Series 8118, Apr. 24, 2015, 6 pp.
European Patent Office, European Search Report issued in corresponding European application No. 19189107.6, dated Feb. 4, 2020, 13 pp.
Chinese Patent Office, First Office Action issued in corresponding Application No. 201910702485.1, dated Dec. 29, 2020, 19 pp.

* cited by examiner

US 11,233,437 B2

ELECTRICAL CONDUIT BOX FOR USE IN AN INDUSTRIAL A/C INDUCTION MOTOR HAZARDOUS ENVIRONMENT

TECHNICAL FIELD

The present invention generally relates to electrical conduit boxes for industrial electrical motors, and more particularly, but not exclusively, to electrical conduit boxes for industrial electrical motors used in a hazardous environment.

BACKGROUND

There is a need to provide electrical conduit boxes suitable for a greater range of operational uses on electrical motors. Some existing systems have various shortcomings relative to certain applications. Accordingly, there remains a need for further contributions in this area of technology.

SUMMARY

One embodiment of the present invention is a unique electrical conduit box. Other embodiments include apparatuses, systems, devices, hardware, methods, and combinations for industrial electrical motor conduit boxes used in a hazardous environment. Further embodiments, forms, features, aspects, benefits, and advantages of the present application shall become apparent from the description and figures provided herewith.

DETAILED DESCRIPTION OF THE ILLUSTRATIVE EMBODIMENTS

Figure 1:
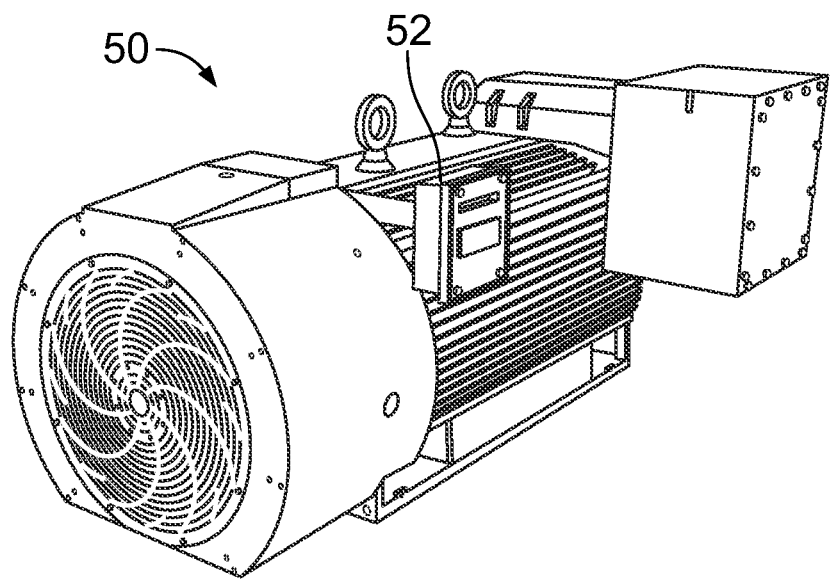
FIG. 1 depicts an industrial electrical motor having a conduit box.

For the purposes of promoting an understanding of the principles of the invention, reference will now be made to the embodiments illustrated in the drawings and specific language will be used to describe the same. It will nevertheless be understood that no limitation of the scope of the invention is thereby intended. Any alterations and further modifications in the described embodiments, and any further applications of the principles of the invention as described herein are contemplated as would normally occur to one skilled in the art to which the invention relates.

With reference to FIG. 1, an electric motor 50 is disclosed which can be used in a variety of applications such as within the petrochemical industries, food and beverage, pharmaceuticals. The electric motor can be an industrial size, large AC induction motor. Some non-limiting embodiments of the electric motor 50 include those that are capable of producing from 350 HP to 1500 HP, and can range from 400 V-4000 V and 33 full load amps-1700 full load amps. The electric motor 50 includes a specially designed conduit box 52 useful in applications in which the industrial size electric motor 50 is placed in a hazardous location. Such hazardous locations can include, but not be limited to, those in which combustible/flammable materials such as gases, vapors, etc are present intermittently. In some forms the hazardous locations could also include continuous presence of combustible/flammable materials. Examples of hazardous locations include those in which dust is present such as in food processing applications, or those in which dangerous vapors are present such as in petrochem related locations. The conduit box 52 is used to connect/splice wiring together and in which the box 52 includes specialty features that satisfy safety requirements from relevant authorities, such as those in NEMA, UL, CSA, etc in the United States, Canada, and elsewhere.

Figure 2:
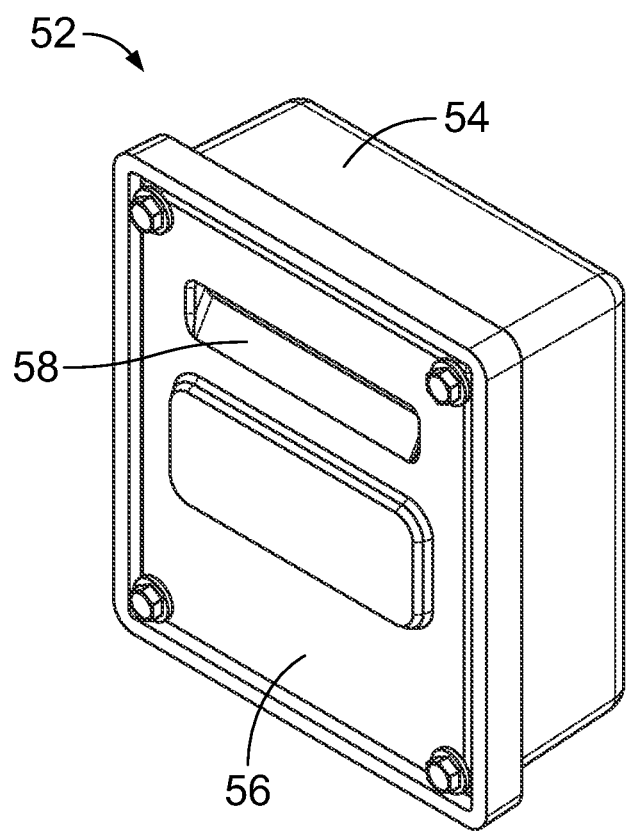
FIG. 2 depicts an embodiment of an electrical conduit box of FIG. 1.
Figure 3:
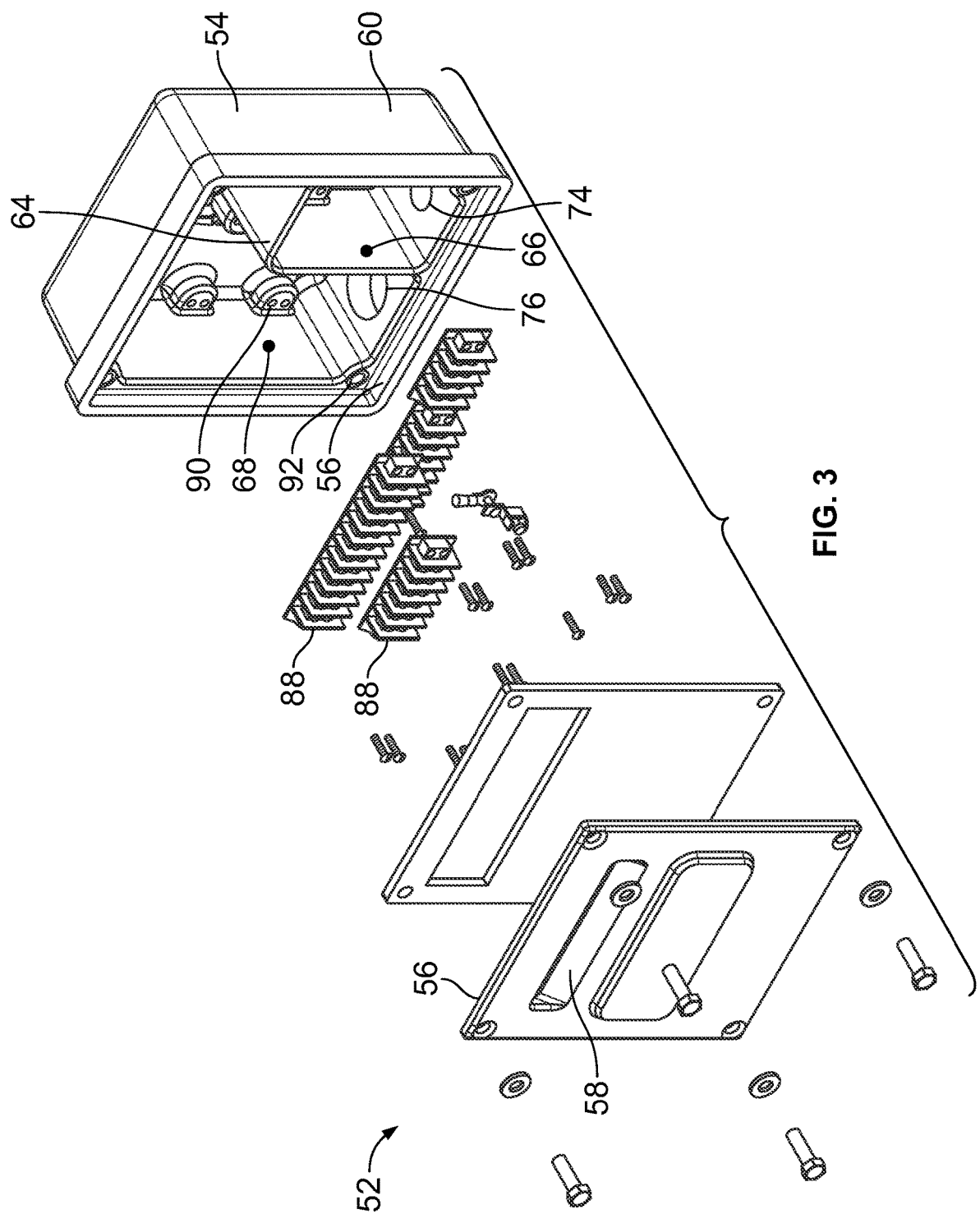
FIG. 3 depicts an embodiment of an electrical conduit box of FIG. 1.
Figure 4:
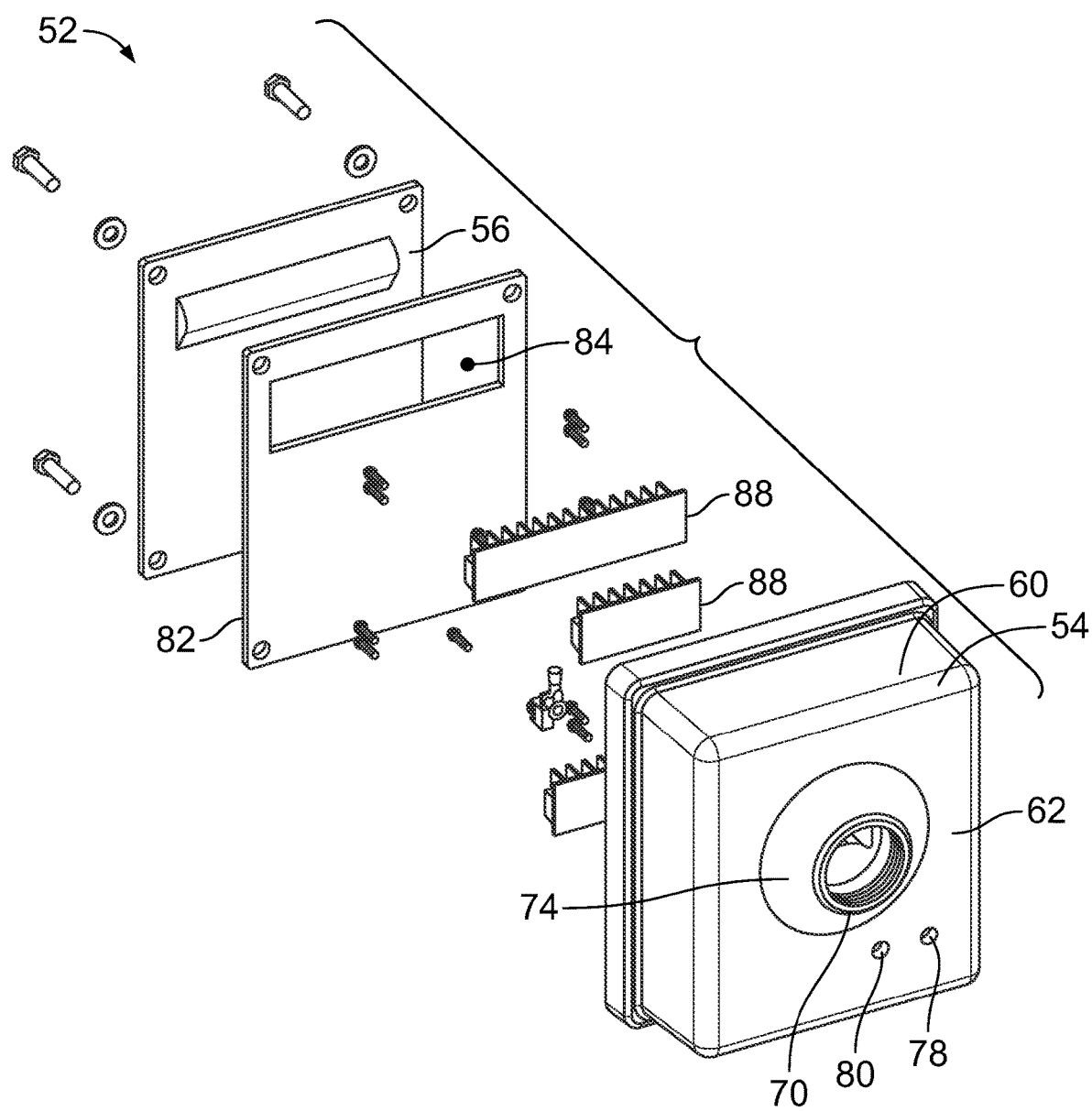
FIG. 4 depicts an embodiment of an electrical conduit box of FIG. 1.

FIGS. 2-4 illustrate one embodiment of the conduit box 52. The conduit box 52 generally includes a housing 54 that forms an internal space for wiring connections, along with a cover 56 used to close off the internal space from outside conditions. The cover 56 can include a finger hold 58 formed as a depression in the cover 56, but otherwise the cover 56 is a solid cover which, when fastened to the housing 54 as described below, acts to prevent and/or discourage entry of dust, liquids, or other foreign debris into the internal space of the housing 54.

As will be described further below, the housing 54 and cover 56 are made from a composite material found to be adaptable for use in a compression molded construction. Such molded construction provides for an integral construction of the housing 54 including several internal features discussed below. The composite material is non-metallic material and includes a cross-linked polymer matrix with a glass fiber content of about 26% by weight. Such a construction has been found to maintain thermosetting dimensional stability over a range of operating conditions of the conduit box. The material is furthermore formed from a composition of polyesters and vinyl ester thermoset molding compound which provides irreversible cross-linked polymer matrix composite upon curing. A particular form of material is a bulk molding compound (BMC) supplied by IDI Composites and designated as number 46-16-26. Such a material has been found to provide the often competing requirements of strength, flame resistance, bending, pullout, torque, impact resistance, and crush resistance. Wall thicknesses used in the conduit box meet the 5VA flame rating of UL-94. The conduit box with associated features described below satisfies IP67 standard of being protected from dust and protected against the effects of immersion in water to depth between 15 cm and 1 meter. In one form the conduit box 52 is constructed to withstand a compression force applied by a flat surface 4×10 inches in area, where each force applicator exerts 100 pounds of force on the same for 1 minute. Depending on the dimensions selected for the conduit box, as many applicators can be applied that the box will accommodate, up to a maximum of 8. The conduit box 52 can be rated up to IP67, and the material composition and layout of the box can be provided such that certification is provided via relevant Canadian and US authorities (e.g. CSA and UL).

Other features of the housing 54 can be seen more clearly in FIGS. 3 and 4. The internal space of the housing 54 is generally formed by sidewalls 60 that extend from a back plate 62, and includes a partition wall 64 used to separate the internal space into a first compartment 66 and second compartment 68. The first compartment 66 is designated as a high voltage compartment, while the second compartment 68 is designated as a low voltage compartment. In one form the high voltage compartment 66 is suitable to contain 240 V connections, and the low voltage compartment 68 is suitable to contain 24 V connections. The high voltage compartment 66 can be used to connect wiring useful to provide space heater functionality to the motor, while the low voltage compartment 68 can be used to provide connections for thermal sensors such as, but not limited to, resistance thermal detectors (RTDs). In one form the low voltage compartment 68 can include provisions to connect 24-12 AWG wiring, while the high voltage compartment 66 can include provisions to connect 16-10 AWG wiring.

It will be appreciated that the composite, compression molded construction results in an integral formation of the housing 54. For example, the sidewalls 60, partition wall 64, and back plate 62 are integral with each other which lends support to achieve the various competing requirements of strength, flame resistance, bending, pullout, torque, impact resistance, and crush resistance. The integral construction results in a finished component in which one part is intimately tied to another part. In this sense the sidewalls 60 mentioned above may be considered in some cases to be a single outer sidewall that extends around the periphery of the internal space. No limitation is hereby intended by reference to sidewalls in the plural, when it will be appreciated that the integral construction can render the view that the outer periphery is a single sidewall.

Figure 6:
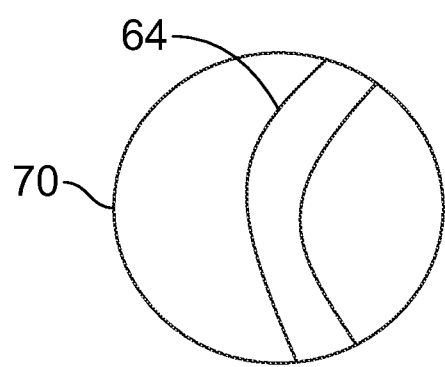
FIG. 6 depicts an aperture and partition wall of an electrical conduit box.

The conduit box 52 also includes several other features making it suitable for use with the industrial size large AC induction motor 50. The back plate 62 of the conduit box 52 includes a central threaded aperture 70 useful to receive electrical conduit from the motor 50 that are bound for either the first compartment 66 or the second compartment 68. The central threaded aperture 70 is a molded construction, one form of which includes tapered threads and/or NPT pipe threads. As can be seen in FIG. 6, the partition wall 64 extends across the opening 70 to segregate the through passage into a portion that communicates with the high voltage compartment 66 and a portion that communicates with the low voltage compartment 68. The partition wall 64 is shown as being biased to one side of the central threaded aperture 70 as it spans the opening formed by the aperture 70, but it will be appreciated that the partition wall 64 can span the aperture 70 in any variety of arrangements. The central threaded aperture 70 can include a raised portion 72 as seen in FIG. 4.

The housing 54 can also include several other through passages shown in FIGS. 3 and 4. A first compartment passage 74 and a second compartment passage 76 are illustrated in FIG. 3 and are used to provide customer connections internal to the housing 54. Electrical wiring from the motor 50 that are bound for the interior of the housing 54 are passed through the central threaded aperture 70 whereupon they are split for routing to either compartment 66 or 68. Likewise in FIG. 4, passages 78 and 80 can be present in the back plate 62 to permit entry of additional wiring, such as RTD sensors for bearings used in the motor 50. Any of the passages 74, 76, 78, and 80 can be threaded in similar fashion to the various embodiments of the threaded aperture 70. Thus, all connections into and out of the conduit box 52 can be proofed for pullout, bending, etc.

A gasket 82 can be provided between the housing 54 and the cover 56. The gasket 82 can include a cutout 84 useful to receive the finger hold 58 when formed as a depression into the cover 56. The gasket 82 is sized to fit within a lip 86 formed around the periphery of the housing 54. The gasket 82 can be nested within the lip 86 can captured in place when the cover 56 is affixed in place. The gasket 82 can be made from neoprene to assist in maintaining the sealed nature of the compartments. To that end, the partition wall 64 is of a height that the gasket 82 is captured between the cover 56 and the top of the wall 64 so as to create sealed compartments 66 and 68 which are sealed from one another but also sealed from outside environment.

The housing 54 also includes additional features related to terminal blocks 88 which can be affixed to the housing 54 via fasteners that engage with terminal block mountings 90. The housing 54 can also include cover mountings 92 useful to affix the cover 56 to the housing 54 via fasteners. Both of the terminal block mountings 90 and the cover mountings 92 can be metallic inserts made of brass or stainless steel and are molded in place during formation of the housing 54. The mountings, or metallic inserts, 90 and 92 can include an external feature useful to discourage removal of the mountings 90 and 92 from the housing 54. Such features can include a barbed projection.

The conduit box 52 can be painted to provide UV protection. In one form the housing 54 and/or cover 56 can be scuffed with a suitable abrasive such as sand paper to prepare the surface for adhesion with a coating such as primer or paint.

Figure 5:
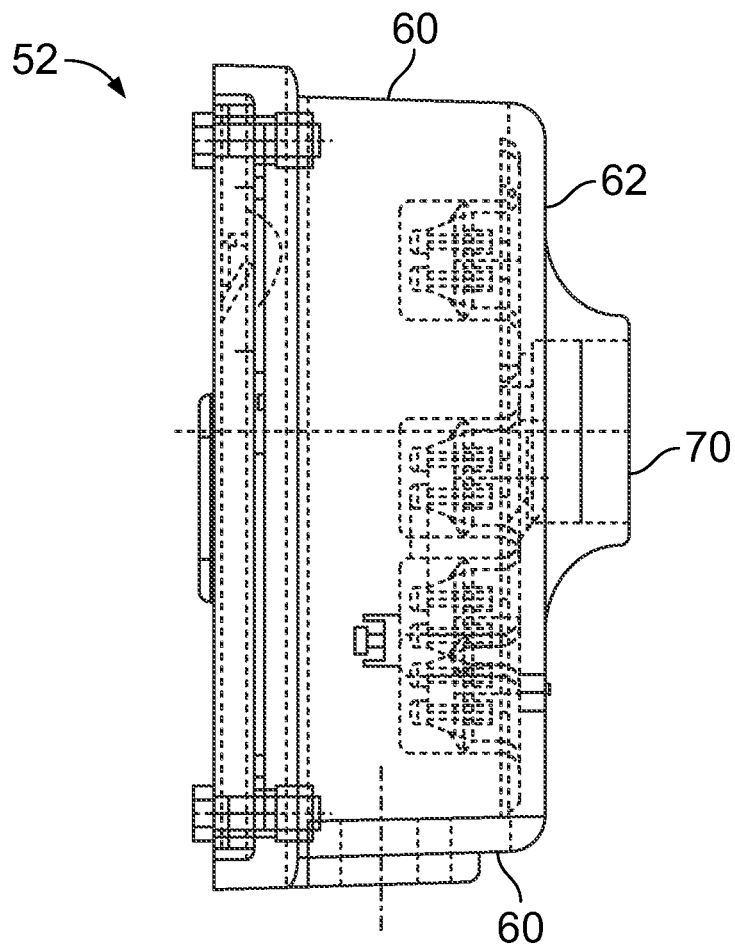
FIG. 5 depicts an embodiment of an electrical conduit box of FIG. 1.

To provide suitable features for the motor mount application several other features can be found in the housing 54. At least one of the sidewalls 60 and partition wall 64 are tapered such that a thickness of the sidewalls 60 and/or partition wall 64 change as the walls extends between the cover side of the conduit box 52 and the back plate side of the conduit box. To set forth a straightforward explanation, each of the walls by definition will have a thickness formed between opposing walls. For example, each of the sidewalls 60 forming the exterior of the conduit box 52 have an outside facing wall and an inside facing wall. The partition wall 64 includes a wall facing the first compartment 66 and a wall facing the second compartment 68. The thickness of each of these walls varies along the depth of the walls (i.e. along the direction as the walls extend between the cover side and the back plate side). In one form the thickness of the walls 60 and/or 64 near or at the back plate 62 of the conduit box 52 is larger than the thickness of the walls 60 and/or 64 near or at the cover side of the conduit box 52. All walls 60 and/or 64 can be defined by a draft angle which can take on any angled value. For example, all or some of the inside facing walls of the sidewalls 60 can have a draft angle in which the cross sectional area of the open interior of the conduit box is largest at the cover side of the conduit box relative to the cross sectional area nearest the back plate side. Likewise, the cross sectional area of either or both the first compartment 66 and second compartment 68 can be largest at the cover side than at the back plate side. In some forms the tapered walls may be angled relative to the back plate. FIG. 5 illustrates one example where the walls 60 are slightly tapered such that the distance between the top side wall and the bottom side wall as depicted in the illustration is smallest at the back plate side of the conduit box 52. The thickness of the walls 60 and/or 62 can be 5 mm or higher to pass relevant flame testing. Construction of the box also permits a 2" steel ball dropped from 51" high in order to impact with 6.8 Joules, or 5 ft-lb. In some forms the construction also permits an impact at 13.8 J and under three different conditions: part at −40 C, room temp, and heated in direct sunlight for several hours.

The molds used to form the conduit box 52 can be made from several components, some of which can have threaded features. For example, one mold part can be used to form the molded threads of aperture 70, another mold part can be used to form the molded threads of passage 74, another mold part can be used to form the molded threads of passage 76, and yet another mold part can be used to form the molded threads of passage(s) 80. A back side mold can be used to form the back while a front side mold can be used to form the front, open interior, and the partition wall 64.

One aspect of the present application provides an apparatus comprising a conduit box constructed to receive electrical conduits having a gauge suitable for use in an electric motor, the conduit box including: a housing having sidewalls that extend from a back plate to form an open interior and constructed from a non-metallic material of a composite construction having glass fibers which maintains thermosetting dimensional stability, the housing also including a partition wall structured to define a first voltage compartment and a second voltage compartment independent from one another within the open interior to segregate low voltage from high voltage circuits, the back plate including an aperture that spans the partition wall to form a first through passage to the first compartment and a second through passage to the second compartment, and a cover plate sized to extend over the open interior to form an enclosed conduit box when affixed to at least one of the sidewalls.

A feature of the present application provides wherein the composite construction includes a cross-linked polymer matrix and a glass content of about 26% by weight.

Another feature of the present application provides wherein the conduit box is a molded construction in which the housing, partition wall, and sidewalls are an integral construction, and wherein the glass fibers are randomized fibers.

Yet another feature of the present application provides wherein the composite construction is formed from a composition of polyesters and vinyl ester thermoset molding compound.

Still another feature of the present application provides wherein the composite construction is fire resistant, which further includes a molded threaded aperture in the back plate, and wherein the partition wall bridges across the molded threaded aperture.

Yet still another feature of the present application provides wherein the threaded aperture is structured to be fastened to a motor mount, and which further includes metallic inserts affixed to the conduit box during the molding formation of the conduit box, the metallic inserts having a protrusion to discourage removal from the conduit box.

Still yet another feature of the present application provides wherein the threaded aperture is a tapered threaded aperture, and wherein the partition wall is tapered along its depth as the partition wall extends from a front side of the conduit box to the back plate, the partition wall integral with the back plate.

A further feature of the present application includes a cover having a finger hold recess and a gasket, the cover made of the cross-linked polymer matrix, wherein the cover captures the gasket in a recessed lip of the housing when the cover is affixed to the housing with threaded fasteners, the gasket forming a seal to discourage entry of dust and water into the open interior and forming a seal to maintain separation of the first voltage compartment from the second voltage compartment.

A still further feature of the present application provides wherein the conduit box includes a plurality of through passages in one of the plurality of sidewalls.

A yet still further feature of the present application provides wherein one of the sidewalls includes a first through passage having tapered molded threads and which is in communication with the first voltage compartment, and wherein the one of the sidewalls includes a second through passage having tapered molded threads and which is in communication with the second voltage compartment.

Another aspect of the present application provides an apparatus comprising an electric motor conduit box having a housing defining an open interior and a cover used to enclose the open interior of the housing, the housing having back wall and a peripheral outer sidewall both of which are used to form the open interior, the housing also including an internal partition used to separate a first compartment from a second compartment, the sidewall and internal partition integrally molded together using an irreversible cross-linked polymer matrix composite constructed to maintain dimensional stability over a range of operating conditions, the housing including a first integral molded landing having a first metal insert embedded within the integral molded landing, the first metal insert structured to receive a cover fastener, and a second integral molded landing structured to receive a second metallic insert useful in attaching a terminal block to the interior of the electric motor conduit box.

A feature of the present application provides wherein the partition wall includes a thickness that increases as the wall progresses from a cover side of the housing to a back wall side of the housing.

Another feature of the present application provides wherein the partition wall is defined by a draft angle as the wall slopes from the cover side of the housing to a back wall side of the housing.

Yet another feature of the present application provides wherein the housing includes a peripheral lip, and which further includes a cover and a gasket, the cover and gasket sized to nest in the peripheral lip.

Still another feature of the present application provides wherein the irreversible cross-linked polymer matrix composite is formed from a glass filled composite material composed of polyesters and vinyl ester thermoset molding compounds.

Yet still another feature of the present application provides wherein partition wall spans a threaded opening formed in the back wall to form a first pass through to the first compartment and a second pass through to the second compartment, and wherein the peripheral outer sidewall includes a first molded threaded opening in communication with the first compartment and a second molded threaded opening in communication with the second compartment.

A further feature of the present application provides wherein the back wall includes a threaded opening which is spanned by a back wall side of the partition such that a first part of the threaded opening communicates with the first compartment and a second part of the threaded opening communicates with the second compartment.

A yet further feature of the present application provides wherein the opening of the back wall includes a molded tapered thread feature, and wherein the cross-linked polymer matrix composite includes randomized glass fibers.

A still yet further feature of the present application provides wherein the glass fiber content is 26% by weight.

Yet a still further feature of the present application includes a cover and a gasket, the cover including a finger hold depression formed therein, the gasket including a cutout sized to accommodate the finger hold depression formed in the cover, the gasket sized to seal an outer periphery of the cover to discourage water intrusion into the first compartment and second compartment, the gasket also sized to engage the cover on an enclosure side of the cover and to engage the internal partition on a cover side of the internal partition, the engagement of the gasket with the cover and the internal partition structured to seal the first compartment relative to the second compartment.

While the invention has been illustrated and described in detail in the drawings and foregoing description, the same is to be considered as illustrative and not restrictive in character, it being understood that only the preferred embodiments have been shown and described and that all changes and modifications that come within the spirit of the inventions are desired to be protected. It should be understood that while the use of words such as preferable, preferably, preferred or more preferred utilized in the description above indicate that the feature so described may be more desirable, it nonetheless may not be necessary and embodiments lacking the same may be contemplated as within the scope of the invention, the scope being defined by the claims that follow. In reading the claims, it is intended that when words such as "a," "an," "at least one," or "at least one portion" are used there is no intention to limit the claim to only one item unless specifically stated to the contrary in the claim. When the language "at least a portion" and/or "a portion" is used the item can include a portion and/or the entire item unless specifically stated to the contrary. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

What is claimed is:

1. An apparatus comprising:
a conduit box constructed to receive electrical conduits having a gauge suitable for use in an electric motor, the conduit box including:
a housing having sidewalls that extend from a back plate to form an open interior and constructed from a non-metallic material of a composite construction having glass fibers which maintains thermosetting dimensional stability, the housing also including a partition wall structured to define a first voltage compartment and a second voltage compartment independent from one another within the open interior to segregate low voltage from high voltage circuits, the back plate including an aperture that spans the partition wall to form a first through passage to the first compartment and a second through passage to the second compartment;
a cover plate sized to extend over the open interior to form an enclosed conduit box when affixed to at least one of the sidewalls; and
a gasket, wherein the cover plate captures the gasket in a recessed lip of the housing when the cover plate is affixed to the housing, the partition wall being of a height that the gasket is captured between the cover plate and the partition wall so as to seal the first voltage compartment and the second voltage compartment from each other and the outside environment.

2. The apparatus of claim 1, wherein the composite construction includes a cross-linked polymer matrix and a glass content of about 26% by weight.

3. The apparatus of claim 2, wherein the conduit box is a molded construction in which the housing, partition wall, and sidewalls are an integral construction, and wherein the glass fibers are randomized fibers.

4. The apparatus of claim 3, wherein the composite construction is formed from a composition of polyesters and vinyl ester thermoset molding compound.

5. The apparatus of claim 4, wherein the composite construction is fire resistant, which further includes a molded threaded aperture in the back plate, and wherein the partition wall bridges across the molded threaded aperture.

6. The apparatus of claim 5, wherein the threaded aperture is structured to be fastened to a motor mount, and which further includes metallic inserts affixed to the conduit box during the molding formation of the conduit box, the metallic inserts having a protrusion to discourage removal from the conduit box.

7. The apparatus of claim 6, wherein the threaded aperture is a tapered threaded aperture, and wherein the partition wall is tapered along its depth as the partition wall extends from a front side of the conduit box to the back plate, the partition wall integral with the back plate.

8. The apparatus of claim 4, which further includes a cover having a finger hold recess and a gasket, the cover made of the cross-linked polymer matrix, wherein the cover captures the gasket in the recessed lip of the housing when the cover is affixed to the housing with threaded fasteners, the seal configured to discourage entry of dust and water into the open interior.

9. The apparatus of claim 8, wherein the conduit box includes a plurality of through passages in one of the plurality of sidewalls.

10. The apparatus of claim 9, wherein one of the sidewalls includes a first through passage having tapered molded threads and which is in communication with the first voltage compartment, and wherein the one of the sidewalls includes a second through passage having tapered molded threads and which is in communication with the second voltage compartment.

11. An apparatus comprising:
an electric motor conduit box having a housing defining an open interior and a cover used to enclose the open interior of the housing, the housing having back wall and a peripheral outer sidewall both of which are used to form the open interior, the housing also including an internal partition used to separate a first compartment from a second compartment, the sidewall and internal partition integrally molded together using an irreversible cross-linked polymer matrix composite constructed to maintain dimensional stability over a range of operating conditions, the housing including a first integral molded landing having a first metallic insert embedded within the integral molded landing, the first metallic insert structured to receive a cover fastener, and a second integral molded landing structured to receive a second metallic insert useful in attaching a terminal block to the interior of the electric motor conduit box;
a cover and a gasket, wherein the cover captures the gasket in a recessed lip of the housing when the cover is affixed to the housing, the gasket forming a seal against the internal partition and the cover to seal the first voltage compartment and the second voltage compartment from each other and the outside environment.

12. The apparatus of claim 11, wherein the partition wall includes a thickness that increases as the wall progresses from a cover side of the housing to a back wall side of the housing.

13. The apparatus of claim 12, wherein the partition wall is defined by a draft angle as the wall slopes from the cover side of the housing to a back wall side of the housing.

14. The apparatus of claim 13, wherein the housing includes a peripheral lip, the cover and gasket sized to nest in the peripheral lip.

15. The apparatus of claim 14, wherein the irreversible cross-linked polymer matrix composite is formed from a glass filled composite material composed of polyesters and vinyl ester thermoset molding compounds.

16. The apparatus of claim 15, wherein partition wall spans a threaded opening formed in the back wall to form a first pass through to the first compartment and a second pass through to the second compartment, and wherein the peripheral outer sidewall includes a first molded threaded opening in communication with the first compartment and a second molded threaded opening in communication with the second compartment.

17. The apparatus of claim 11, wherein the back wall includes a threaded opening which is spanned by a back wall side of the partition such that a first part of the threaded opening communicates with the first compartment and a second part of the threaded opening communicates with the second compartment.

18. The apparatus of claim 17, wherein the opening of the back wall includes a molded tapered thread feature, and wherein the cross-linked polymer matrix composite includes randomized glass fibers.

19. The apparatus of claim 18, wherein the glass fiber content is 26% by weight.

20. An apparatus comprising:
   an electric motor conduit box having a housing defining an open interior and a cover used to enclose the open interior of the housing, the housing having back wall and a peripheral outer sidewall both of which are used to form the open interior, the housing also including an internal partition used to separate a first compartment from a second compartment, the sidewall and internal partition integrally molded together using an irreversible cross-linked polymer matrix composite constructed to maintain dimensional stability over a range of operating conditions, the housing including a first integral molded landing having a first metallic insert embedded within the integral molded landing, the first metallic insert structured to receive a cover fastener, and a second integral molded landing structured to receive a second metallic insert useful in attaching a terminal block to the interior of the electric motor conduit box; and
   a cover and a gasket, the cover including a finger hold depression formed therein, the gasket including a cut-out sized to accommodate the finger hold depression formed in the cover, the gasket sized to seal an outer periphery of the cover to discourage water intrusion into the first compartment and second compartment, the gasket also sized to engage the cover on an enclosure side of the cover and to engage the internal partition on a cover side of the internal partition, the engagement of the gasket with the cover and the internal partition structured to seal the first compartment relative to the second compartment.

* * * * *